(12) United States Patent
Kudo et al.

(10) Patent No.: US 7,667,933 B2
(45) Date of Patent: Feb. 23, 2010

(54) MAGNETIC OSCILLATING DEVICE BASED ON SPIN TRANSFER TORQUE AND MAGNETIC SENSOR USING THE SAME

(75) Inventors: Kiwamu Kudo, Kawasaki (JP); Rie Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 11/389,066

(22) Filed: Mar. 27, 2006

(65) Prior Publication Data

US 2006/0222835 A1 Oct. 5, 2006

(30) Foreign Application Priority Data

Mar. 31, 2005 (JP) ............... 2005-103607

(51) Int. Cl.
*G11B 5/33* (2006.01)
(52) U.S. Cl. .................................................. 360/313
(58) Field of Classification Search ................. None
See application file for complete search history.

(56) References Cited

U.S. PATENT DOCUMENTS 5,695,864 A    12/1997  Slonczewski
6,975,110 B2 * 12/2005  Kaiju et al. ................. 324/252
2005/0024788 A1 *  2/2005  Sato et al. .................... 360/324
2005/0219771 A1 * 10/2005  Sato et al. ................. 360/324.2
2006/0039089 A1 *  2/2006  Sato ............................ 360/324

OTHER PUBLICATIONS

L. Berger, "Emission of spin waves by a magnetic multilayer traversed by a current", The American Physical Society, Physical Review B, vol. 54, No. 13, Oct. 1, 1996, pp. 9353-9358.
J.C. Slonczewski, "Current-driven excitation of magnetic multilayers", Journal of Magnetism and Magnetic Materials, 159, 1996, pp. L1-L7.

* cited by examiner

*Primary Examiner*—David D Davis
(74) *Attorney, Agent, or Firm*—Oblon, Spivak, McClelland, Maier & Neustadt, L.L.P.

(57) ABSTRACT

A magnetic oscillating device including a first magnetic resonance layer with a first magnetic resonance frequency $f_1$, a second magnetic resonance layer with a second magnetic resonance frequency $f_2$ higher than the first magnetic resonance frequency $f_1$, a nonmagnetic layer sandwiched between the first magnetic resonance layer and the second magnetic resonance layer, and a pair of electrodes which supplies a current perpendicularly to film planes of the first and second magnetic resonance layers, in which a difference $(f_2-f_1)$ between the two magnetic resonance frequencies is larger than half a resonance line width of the first magnetic resonance layer, and a ratio of the two magnetic resonance frequencies $f_2/f_1$ is 1.6 or less.

17 Claims, 6 Drawing Sheets

MAGNETIC OSCILLATING DEVICE BASED ON SPIN TRANSFER TORQUE AND MAGNETIC SENSOR USING THE SAME

CROSS-REFERENCE TO RELATED APPLICATIONS

This application is based upon and claims the benefit of priority from prior Japanese Patent Application No. 2005-103607, filed Mar. 31, 2005, the entire contents of which are incorporated herein by reference.

BACKGROUND OF THE INVENTION

1. Field of the Invention

The present invention relates to a magnetic oscillating device, and a magnetic sensor, a magnetic head, and a magnetic reproducing apparatus using the magnetic oscillating device.

2. Description of the Related Art

In recent years, a giant magnetoresistive (GMR) element has been commonly used in a magnetic head of a hard disk drive. The spin valve film has a structure in which a magnetization free layer (free layer), a nonmagnetic layer (spacer layer), a magnetization pinned layer (pinned layer), and an antiferromagnetic layer are stacked. In the spin valve film, the magnetization of the pinned layer in fixed by exchange bias with the antiferromagnetic layer, and only the magnetization of the free layer is rotated by an external field so as to change the relative angle between the directions of the magnetizations of the pinned layer and free layer, making it possible to provide a high magnetoresistive effect (MR ratio). Thus, the spin valve film can sensitively detect magnetic signals recorded in a magnetic recording medium.

However, increase in the density of magnetic recording medium has increasingly reduced the size of recording bits and thus the amount of leakage flux, that is, the amount of signal field, from recording bits. Also, so-called thermal noise has significantly reduced the signal-to-noise ratio (SNR). Under the circumstances, to develop a novel element that can sensitively detect a signal field in a high SNR even with a reduced field becomes a major technical challenge.

On the other hand, a spin-wave generator has been proposed which utilizes the motion of magnetization generated when a current is supplied perpendicularly to the film plane of a magnetic multilayer having a structure similar to that of the spin valve film (see Physical Review B. Volume 54, 9353 (1996)). The spin-wave generator includes a three-layer structure of a first ferromagnetic layer, a nonmagnetic layer, and a second ferromagnetic layer. The first ferromagnetic layer has magnetization pinned in a certain direction. The magnetization of the second magnetization layer can rotate freely. When a current is supplied perpendicularly to the film plane of the three-layer structure, electrons are spin-polarized when passing through the first ferromagnetic layer. The polarized current is then injected into the second ferromagnetic layer, where the spins of the electrons interact with the magnetization of the second ferromagnetic layer to excite a spin wave. A sensitive magnetic sensor based on this new principle can be developed by utilizing external-field dependency of a spin wave generated by such a spin-wave generator.

However, since the magnetization of the first ferromagnetic layer in the two ferromagnetic layers is pinned and only the second ferromagnetic layer contributes to the oscillation of a spin wave, the above conventional technique provides a low output. Further, with the conventional technique, the relative angle between the directions of the magnetizations of the first and second ferromagnetic layers vary every moment during magnetic oscillation. This induces magnetic dipole interaction between the two magnetizations, resulting in unavoidable energy loss. Therefore, the conventional technique disadvantageously has low energy efficiency.

BRIEF SUMMARY OF THE INVENTION

A magnetic oscillating device according to an aspect of the present invention comprises: a first magnetic resonance layer with a first magnetic resonance frequency $f_1$; a second magnetic resonance layer with a second magnetic resonance frequency $f_2$ higher than the first magnetic resonance frequency $f_1$; a nonmagnetic layer sandwiched between the first magnetic resonance layer and the second magnetic resonance layer; and a pair of electrodes which supplies a current perpendicularly to film planes of the first and second magnetic resonance layers, wherein a difference $(f_2-f_1)$ between the two magnetic resonance frequencies is larger than half a resonance line width of the first magnetic resonance layer, and a ratio of the two magnetic resonance frequencies $f_2/f_1$ is 1.6 or less.

A magnetic sensor according to another aspect of the present invention comprises: the above magnetic oscillating device; and a detector detecting, as a variation in resistance, a variation depending on an external field in an angle between magnetizations of the first and second magnetic resonance layers where two magnetizations are in precessions with a matched resonance frequency, the precessions being excited by supplying a current.

A magnetic head according to still another aspect of the present invention comprises: the above magnetic oscillating device; a domain control layer which applies a bias field to the magnetic oscillating device to control magnetic domains in the first and second magnetic resonance layers; an insulating layer provided so as to allow a current to be supplied perpendicularly to a film plane of the magnetic oscillating device; and a pair of magnetic shield layers sandwiching the magnetic oscillating device.

A magnetic reproducing apparatus according to yet another aspect of the present invention comprises the above magnetic head, and a magnetic recording medium.

DETAILED DESCRIPTION OF THE INVENTION

Embodiments of the present invention will be described hereinafter.

A magnetic oscillating device according to an embodiment of the present invention comprises a stacked film including two magnetic resonance layers and one nonmagnetic layer sandwiched therebetween, and causes magnetic oscillation by supplying a current perpendicularly to the film plane. Both magnetic resonance layers are magnetization free layers whose magnetization is not pinned. In the magnetic oscillating device according to the embodiment of the present invention, the magnetizations of the two magnetic resonance layers precess with a matched phase when they are oscillated. The precessions with a matched phase will be described below in detail.

First, description will be given of a magnetic resonance frequency that is an important physical quantity relating to the precession phenomenon of magnetization. As an approach for examining the dynamic characteristics of a magnetic material, there is known a ferromagnetic resonance absorption phenomenon due to a microwave. This is referred to as a phenomenon in which a precession of the magnetization is excited by applying the microwave (i.e., an oscillating field) to the magnetic material. This phenomenon can be observed by examining how the energy of the microwave is absorbed by the motion of magnetization.

Figure 1:
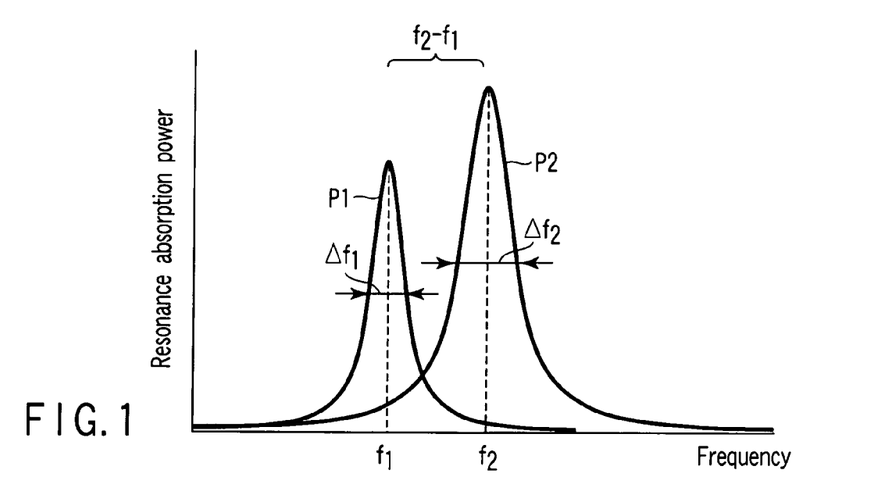
FIG. 1 is a diagram schematically showing magnetic resonance absorption peaks of magnetizations of two magnetic materials.

FIG. 1 schematically shows the magnetic resonance absorption peaks of magnetizations of two different magnetic materials. When the intrinsic frequency of a magnetization matches the frequency of a microwave, the precession is most strongly excited to generate a resonance absorption peak. FIG. 1 shows the resonance absorption peaks P1 and P2 of two magnetic materials. The frequency provides the resonance absorption peak is referred to as the magnetic resonance frequency $f_R$ (represented as $f_1$ and $f_2$ in FIG. 1). A typical property of the resonance absorption peak is the resonance line width $\Delta f_R$ (represented as $\Delta f_1$ and $\Delta f_2$ in FIG. 1) that is a full width at half maximum. This is a quantity relating to energy loss of magnetization. The values of $f_R$ and $\Delta f_R$ relate to a magnetic field acting on the magnetization. For a thin film ferromagnetic material such as the magnetic resonance layer in the embodiment of the present invention, $f_R$ and $\Delta f_R$ can approximately be estimated by the following equations:

$$f_R = \gamma\sqrt{(H+H_K)(H+H_K+4\pi M_S)} \quad (1),$$

$$\Delta f_R = \alpha\gamma(2(H+H_K)+4\pi M_S) \quad (2),$$

where $\gamma$ (about $1.76\times10^7$ rad/(Oe·sec)) denotes a gyromagnetic ratio, $\alpha$ denotes a Gilbert damping coefficient that is a quantity relating to energy loss of magnetization, $4\pi M_S$ (were $M_S$ is saturation magnetization) denotes a demagnetizing field perpendicular to the film plane, $H_K$ denotes an anisotropy field, and H denotes an external field such as any bias field other than the demagnetizing field and anisotropy field or a magnetic field from a recording medium. These quantities depend on a magnetic material, film thickness, and external field. Accordingly, $f_R$ and $\Delta f_R$ also vary depending on the magnetic material, film thickness, and external field.

Figure 2:
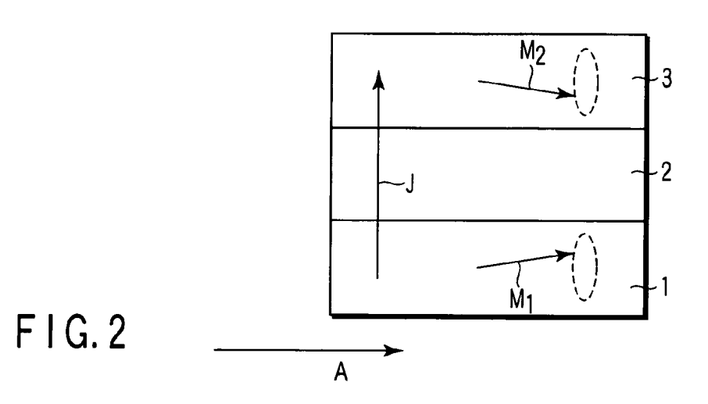
FIG. 2 is a diagram schematically showing a magnetic oscillating device according to an embodiment of the present invention.

As schematically shown in FIG. 2, the magnetic oscillating device according to an embodiment of the present invention comprises a stacked film including a first magnetic resonance layer 1, a nonmagnetic layer 2, and a second magnetic resonance layer 3. Now, the magnetization of the first magnetic resonance layer 1 is defined as $M_1$ and the magnetization of the second magnetic resonance layer 2 is defined as $M_2$; the magnetic resonance frequency specific to the magnetic resonance layer 1 is defined as $f_1$ and the magnetic resonance frequency specific to the magnetic resonance layer 2 is defined as $f_2$. As described above, the magnetic resonance frequency depends on the magnetic material, film thickness, and external field, so that if any of these quantities is different between the first and second magnetic resonance layers 1 and 3, then $f_1 \neq f_2$. Assuming here the following condition: $f_1 < f_2$. Also, the current density of a current passing perpendicularly to the film plane is defined as J. If a current is supplied from the first magnetic resonance layer 1 to the second magnetic resonance layer 3 as shown in FIG. 2, the current density J is defined as J>0. When a current is supplied perpendicularly to the film plane of the stacked film shown in FIG. 2, the two magnetizations $M_1$ and $M_2$ interact while exerting a torque $\Gamma_i$ expressed by the following equation to each other:

$$\Gamma_i = -\gamma a M_i \times (M_1 \times M_2) \quad (3).$$

Equation (3) represents a vector product. The symbol <u>a</u> is in proportion to J and determines the magnitude of the interacting torque. If J is zero, then <u>a</u> is zero. Further, i is 1 or 2, and $\Gamma_1$ denotes a torque exerted on $M_1$ by $M_2$, while $\Gamma_2$ denotes a torque exerted on $M_2$ by $M_1$. The torque expressed by Equation (3) is referred to as a spin transfer torque based on a spin-polarized current and the law of conservation of angular momentum, which is found by Slonczewski (J. Magn. Magn. Mater. 159, L1 (1996)).

In most cases, the motion of magnetization can be described using the Landau-Lifshitz-Gilbert equation (referred to as the LLG equation hereinafter). Thus, the present inventors have examined the motion of the two magnetizations $M_1$ and $M_2$ in FIG. 2 using a modified LLG equation to which a term of the spin transfer torque is added.

$$\frac{dM_i}{dt} = -\gamma M_i \times H_{eff} - \gamma \frac{\alpha}{M_S} M_i \times (M_i \times H_{eff}) + \Gamma_i, \quad (4)$$

where i is 1 or 2.

Figure 3:
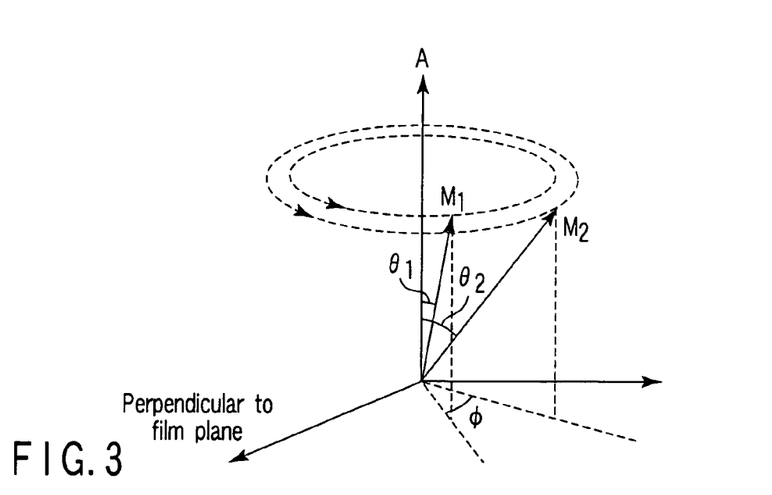
FIG. 3 is a diagram of steady precessions of the magnetic oscillating device according to an embodiment of the present invention.

Here, $H_{eff}$ denotes an effective field acting on the magnetization and including an external field, an anisotropic field, and a demagnetizing field. Equation (4) is a nonlinear simultaneous differential equation, so that it is difficult to precisely derive an analytic solution from Equation (4). Thus, the present inventors have used numerical calculations. It has been found from the calculations that the two magnetizations $M_1$ and $M_2$ perform steady precessions with a matched phase under appropriate conditions. By way of example, FIG. 3 schematically shows the steady precessions of magnetizations observed if both first and second magnetic resonance layers 1 and 3 have magnetic anisotropy in the direction of arrow A. In FIG. 3, $\phi$ denotes an angle between components of the magnetizations $M_1$ and $M_2$ that are projected on a plane perpendicular to the A direction. The precession with a matched phase means that the magnetizations precess around the A axis while maintaining the angle $\phi$ at a constant value. That is, it means that the magnetizations $M_1$ and $M_2$ move around the A axis at the same frequency.

The present inventors have found that the above frequency can be substantially estimated using Equation (5) or Equation (6) that can derive the same value as Equation (5):

$$f = f_1 + a \frac{\sin\theta_2}{\sin\theta_1}\sin\phi = f_2 + a \frac{\sin\theta_1}{\sin\theta_2}\sin\phi, \quad (5)$$

$$f = \frac{f_1 + f_2 + \sqrt{(f_1 - f_2)^2 + 4a^2\sin^2\phi}}{2}. \quad (6)$$

In these equations, $\theta_1$ and $\theta_2$ denote the angles between the A direction and the magnetization $M_1$ and $M_2$, respectively, as shown in FIG. 3. As described above, $\underline{a}$ denotes a quantity relating to the current density J.

Equation (5) or (6) means that the current supplied compensates for the difference between the frequencies $f_1$ and $f_2$ specific to the magnetizations $M_1$ and $M_2$ to match the precession frequencies of the magnetizations $M_1$ and $M_2$, making it possible to obtain magnetic oscillation with a single frequency from the stacked film. Thus, the two magnetic resonance frequencies $f_1$ and $f_2$ must be differed in order to allow the two magnetizations $M_1$ and $M_2$ to precess at the same frequency. A detailed description will be given of conditions under which a precession in phase occurs, including what a degree of the difference can cause a significant precession.

Figure 4:
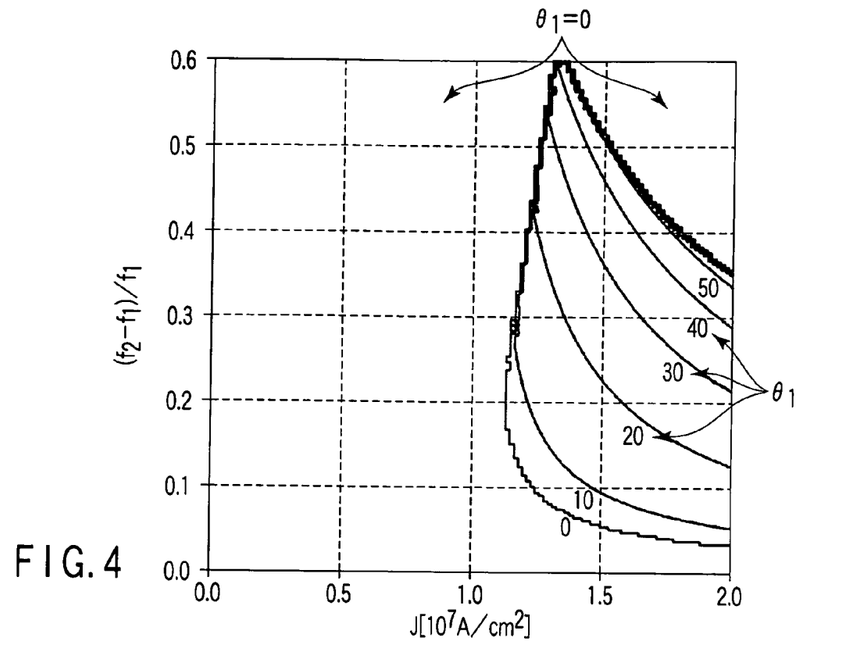
FIG. 4 is a diagram illustrating the range of values for the relative difference $(f_2-f_1)/f_1$ between two magnetic resonance frequencies $f_1$ and $f_2$ and current density J within which a precession occurs.

FIG. 4 illustrates the range of values for the relative difference between the magnetic resonance frequencies $f_1$ and $f_2$ of the two magnetizations $M_1$ and $M_2$, $(f_2-f_1)/f_1$, and the current density J within which the above precession occurs. In this figure, the angle $\theta_1$ is plotted in a contour system against $(f_2-f_1)/f_1$ and J.

Calculation conditions for the contour plot shown in FIG. 4 are as follows. Both the first and second magnetic resonance layers 1 and 3 have magnetic anisotropy in the direction of arrow A. An anisotropic field $H_K$ with a magnetic anisotropy constant $K=5\times10^5$ erg/cm$^3$ acts on the magnetizations. A bias field of the same magnitude as that of $H_K$ acts on the magnetic resonance layer 1. A bias field of not less than the magnitude of $H_K$ acts on the magnetic resonance layer 2. The first and second magnetic resonance layers 1 and 3 have a thickness of 2 nm and a Gilbert damping coefficient $\alpha$ of 0.01. FIG. 4 shows a low current region.

FIG. 4 shows results obtained using the above particular parameter values but indicates the general tendency of magnetization motion in the magnetic oscillating device according to the embodiments of the present invention. Of the numerical values shown in the figure, the absolute value of the current density is mainly varied by the parameter values. FIG. 4 shows that, for the angle $\theta_1=0°$, the two magnetizations remain in a magnetization stabilized direction (the direction of the arrow A) without a precession in the region P and randomly oscillate in the region Q. On the other hand, in the region with $\theta_1>0°$, the two magnetizations precess in a manner that satisfies Equation (5). FIG. 4 shows that a certain magnitude of current density J is required to cause the two magnetizations to precess.

FIG. 4 shows that the condition of $(f_2-f_1)/f_1 \leq 0.6$ is required to cause the two magnetizations to precess. In other words, the ratio of the magnetic resonance frequencies of the two magnetic resonance layers $f_2/f_1$ needs to be 1.6 or less. The present inventors executed calculations using various applicable parameter values different from those used for the calculations in FIG. 4, to find that the upper limit value of $(f_2-f_1)/f_1$ at which the precession of the two magnetizations occurs is between 0.4 and 0.6. The example shown in FIG. 4 shows the largest upper limit value of $(f_2-f_1)/f_1$. When $(f_2-f_1)/f_1 \leq 0.4$, that is, $f_2/f_1$ is 1.4 or less, the two magnetizations precess over a relatively wide range of the value J.

Further, to cause a significant precession, $f_1$ and $f_2$ need to satisfy Equation (7) below, in connection with the difference between the two magnetic resonance frequencies $f_1$ and $f_2$. The significant precession means that the two magnetizations are sufficiently apart from their stabilized direction.

$$f_2 - f_1 > \Delta f_1 / 2 \quad (7).$$

Equation (7) means that the difference $(f_2-f_1)$ between the magnetic resonance frequencies of the two magnetic resonance layers needs to be larger than half the resonance line width $\Delta f_1$ of the first magnetic resonance layer 1. The resonance line width $\Delta f_1$ can be estimated from Equation (2) described above. In FIG. 4, Equation (7) is also satisfied. The magnetizations always fluctuate thermally in fine elements such as the magnetic oscillating device according to the embodiments of the present invention. With a specifically assumed element size, a magnetization fluctuation with $\theta_1$ or $\theta_2$ of about 5° always occurs even for J=0. Thus, preferably $\theta_1$ and $\theta_2$ are larger than 5° so that the magnetization motion results purely from the current J and is not thermally originated. The magnitude of the thermal fluctuation generally relates to the Gilbert damping coefficient $\alpha$. Further, $\Delta f_1$ depends on $\alpha$ according to Equation (2). That is, Equation (7) is a condition for causing a precession through the interaction between the magnetizations $M_1$ and $M_2$ induced by the current J on the basis of Equation (3) with the precession prevented from being dominated by thermal motion.

As described above, the magnetic oscillating device according to the embodiment of the present invention comprises a first magnetic resonance layer with a first magnetic resonance frequency $f_1$, a second magnetic resonance layer with a second magnetic resonance frequency $f_2$, a nonmagnetic layer sandwiched between the first magnetic resonance layer and the second magnetic resonance layer, and a pair of electrodes which supplies a current perpendicularly to the film planes of the first and second magnetic resonance layers and nonmagnetic layer. Further, in order to allow the magnetizations $M_1$ and $M_2$ of the two magnetic resonance layers to precess in phase so as to detect magnetic oscillation of a single frequency, the device meets the conditions that the difference $(f_2-f_1)$ between the two magnetic resonance frequencies is larger than half a resonance line width $\Delta f_1$ of the first magnetic resonance layer and the ratio of the two magnetic resonance frequencies $f_2/f_1$ is 1.6 or less, more preferably 1.4 or less.

In the magnetic oscillating device according to the embodiment of the present invention, the two magnetizations participate to cause magnetic oscillation so that a high output is provided. The magnetic oscillation arises from the motion of the two magnetizations in phase, resulting in a reduced energy loss. The magnetic oscillation in phase further has a particular frequency and only a small broadening of oscillation frequency. As seen in Equation (6) which derives the oscillation frequency, the oscillation frequency depends on the current density J via $\underline{a}$. The oscillation frequency can thus be easily adjusted by the current. An oscillation output is determined by the amplitude of the precession. The magnitude of the oscillation output increases consistently with the difference between the magnetic resonance frequencies (see FIG. 4).

Now, description will be given of a magnetic sensor according to an embodiment of the present invention. The magnetic sensor detects an external field using a device resistance attributed to the angle between the two magnetizations of the first and second magnetic resonance layers included in the above magnetic oscillating device when the precession of the magnetizations is caused.

As schematically shown in FIG. 3, if the two magnetizations cause a precession, a certain finite angle θ is formed between the two magnetizations $M_1$ and $M_2$. The angle θ is expressed by the following equation:

$$\theta = \arccos\left(\frac{M_1 \cdot M_2}{|M_1||M_2|}\right). \quad (8)$$

Figure 5:
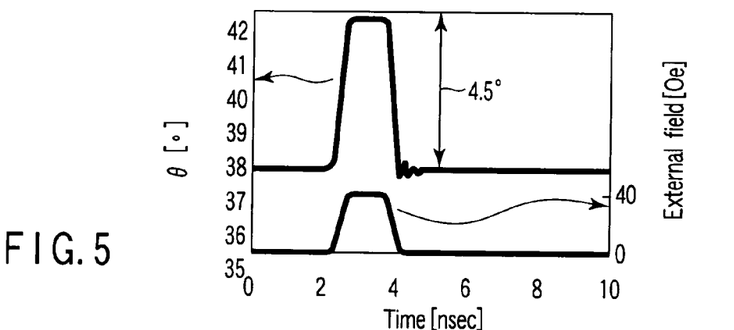
FIG. 5 is a diagram showing an example of a variation with time in the angle θ between two magnetizations.

The angle θ in Equation (8) varies with an external field such as a signal field from a recording medium which varies with time. FIG. 5 shows an example of a variation with time in the angle θ between the two magnetizations. This figure shows a calculation executed under the conditions that a pulse field of magnitude 40 Oe and width of about 2 nsec is applied in the A direction while the magnetizations of the two magnetic resonance layers in which $(f_2-f_1)/f_1$ is 0.4 is caused precession while maintaining about 38° of θ at a current density J of $1.5\times10^7$ A/cm². The application of the pulse field varies the angle θ in a direction in which it increases by $\Delta\theta$ of about 4.5. Stopping the application of the pulse field (0 Oe) returns the two magnetizations to a precession with θ of about 38° maintained. As apparent from the theory of magnetoresistive effect, the device resistance increases consistently with the angle between the magnetizations. Therefore, observing the voltage under a constant current density shows a variation in the device voltage corresponding to a change in angle $\Delta\theta$ of about 4.5. Thus, the magnetic sensor according to the embodiment of the present invention can sense an external field by supplying a current perpendicularly to the magnetic oscillating device and observing a variation in device resistance as a variation in voltage.

The magnetic sensor according to an embodiment of the present invention thus comprises the above magnetic oscillating device and a detector detecting, as a variation in resistance, a variation depending on an external field in an angle between magnetizations of the first and second magnetic resonance layers where two magnetizations are in precessions with a matched resonance frequency, the precessions being excited by supplying a current.

The present invention can provide a magnetic head that uses the above magnetic oscillating device. The magnetic head according to an embodiment of the present invention comprises the above magnetic oscillating device, a domain control layer which applies a bias field to the magnetic oscillating device to control magnetic domains in the first and second magnetic resonance layers, an insulating layer provided so as to allow a current to be supplied perpendicularly to a film plane of the magnetic oscillating device, and a pair of magnetic shield layers sandwiching the magnetic oscillating device.

The present invention can also provide a matrix-type magnetic head comprising unit magnetic heads, each of which comprises the above magnetic head, arrayed in a matrix with an insulating layer interposed therebetween.

To read out a signal field recorded in a magnetic recording medium using the magnetic head according to the embodiment of the present invention, the magnetic head is positioned to face the magnetic recording medium and a current is supplied perpendicularly to the magnetic oscillating device, with a variation in voltage observed.

The magnetic head according to the embodiment of the present invention has an advantage of exhibiting a low reduction in SNR caused by thermal noise than a conventional GMR head. The conventional GMR head reads a signal field by utilizing a slight vibration around a stabilizing point by the magnetization of the free layer. However, the effect of thermal noise is most marked around the stabilizing point. This causes the conventional GMR head to be greatly affected by thermal noise. In contrast, the magnetic head according to the embodiment of the present invention utilizes the precession of the magnetizations of the two magnetic resonance layers included in the magnetic oscillating device. Unlike the slight vibration around the stabilizing point, the precession is the motion of the magnetizations separated far from the original stabilizing point by the current. The precession can thus be sensitively observed without being dominated by thermal fluctuation.

The magnetic head according to the embodiment of the present invention is provided with the domain control layer which applies a bias field to the magnetic oscillating device to control the magnetic domains in the first and second magnetic oscillating layers. This forces the first and second magnetic oscillating layers to have a single magnetic domain to reduce Barkhausen noise caused by movement of magnetic walls, resulting in excellent output stability.

The magnetic head according to the embodiment of the present invention is provided with the insulating layer of a nonmagnetic material with a high resistance around the magnetic oscillating device. A current is then supplied perpendicularly to the film plane of the magnetic oscillating device to avoid shunting a current to the parts other than the magnetic oscillating device. This also avoids noise resulting from the shunting.

The magnetic head according to the embodiment of the present invention can therefore reduce a decrease in SNR caused by thermal noise as well as noise typified by Barkhausen noise. The magnetic head can thus provide a high MR ratio even with a weak signal field to enable reading of data recorded in a high-density magnetic recording medium.

In order to allow the magnetic head according to the embodiment of the present invention to read out a signal field, it is required to cause the precession through resonance of the two magnetizations. The excitation of the precession requires a certain wait time after current supply. A typical magnetic material has an intrinsic frequency of about 10 GHz, and with reference to this, the wait time for the excitation of the precession is about 0.1 to 5 nsec. That is, the two magnetizations cause precessions through resonance after a wait time corresponding to 1 to 50 rounds of precession specific to the magnetic material. Therefore, the read operation by the magnetic head according to the embodiment of the present invention is performed after such a wait time.

Next, description will be given of the specific configurations of the magnetic oscillating device, magnetic head and magnetic reproducing apparatus according to embodiments of the present invention.

The first and second magnetic resonance layers included in the magnetic oscillating device according to the embodiments of the present invention have only to meet the predetermined conditions described above in conjunction with the difference in magnetic resonance frequencies. The first and second magnetic resonance layers may thus be variously configured.

Figure 6:
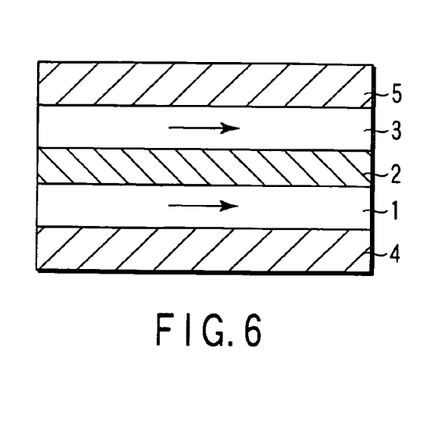
FIG. 6 is a sectional view of a magnetic oscillating device according to a first embodiment of the present invention.

FIG. 6 is a sectional view of a magnetic oscillating device according to the first embodiment of the present invention. As shown in FIG. 6, the lower electrode 4, the first magnetic resonance layer 1, the nonmagnetic layer 2, the second magnetic resonance layer 3, and the upper electrode 5 are stacked. The first magnetic resonance layer 1 has a first magnetic resonance frequency $f_1$ and the second magnetic resonance layer 3 has a second magnetic resonance frequency $f_2$ higher than the first magnetic resonance frequency $f_1$.

The ferromagnetic material forming the first and second magnetic resonance layers 1 and 3 is not limited and may be any of various ferromagnetic materials such as Fe, Co, Ni, an alloy containing these elements, Permalloy, and a Heuslar alloy. The nonmagnetic layer 2 is desirably formed of a nonmagnetic metal material such as Ru, Cu, Ag, and Au. These ferromagnetic and nonmagnetic materials are also used in the other embodiments.

In the magnetic oscillating device shown in FIG. 6, both the first and second magnetic resonance layers 1 and 3 are formed of a ferromagnetic layer with in-plane magnetic anisotropy. The in-plane magnetic anisotropies in both layers are desirably oriented in the same direction to provide a high oscillation output.

The magnetic resonance frequency of each magnetic resonance layer depends on the magnetic anisotropy or saturation magnetization specific to the material. The magnetic resonance frequency can be varied by varying the thickness of the ferromagnetic layer or the planar shape of the film plane or slightly varying the composition ratio of the alloy. The material, film thickness, and shape of the first and second magnetic resonance layers 1 and 3 may be arbitrarily combined provided that the difference $(f_2-f_1)$ between the two magnetic resonance frequencies is larger than half the resonance line width of the first magnetic resonance layer 1 and that the ratio $f_2/f_1$ of the two magnetic resonance frequencies is 1.6 or less.

In another embodiment of the present invention, a bias magnetic film may be provided to apply a bias field to the both sides of at least one of the magnetic resonance layers. The bias magnetic layer enables a variation in the magnetic resonance frequency of the magnetic resonance layer. This is because the bias field varies an effective magnetic anisotropic field. The appropriate bias magnetic film thus makes the difference $(f_2-f_1)$ between the two magnetic resonance frequencies larger than half the resonance line width of the first magnetic resonance layer 1. It also enables the ratio $f_2/f_1$ of the two magnetic resonance frequencies to be adjusted to 1.6 or less. The bias magnetic film may be, for example, a hard magnetic film such as a Co—Pt alloy, a Fe—Pt alloy, and a transition metal-rare earth alloy.

In another embodiment of the present invention, at least one of the magnetic resonance layers may be an exchange-coupled film in which a ferromagnetic layer and an antiferromagnetic layer are stacked. In this case, the magnetic resonance frequency of the exchange-coupled film (i.e., the magnetic resonance layer) can be varied by applying an exchange bias field from the antiferromagnetic layer to the ferromagnetic layer to control the direction or magnitude of the in-plane magnetic anisotropy of the ferromagnetic layer. A material for the antiferromagnetic layer may be FeMn, PtMn, PdMn, NiMn, PdPtMn, or the like.

Figure 7:
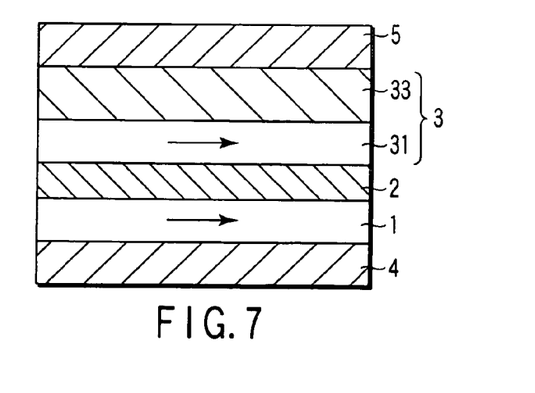
FIG. 7 is a sectional view of a magnetic oscillating device according to a second embodiment of the present invention.

FIG. 7 shows a sectional view of a magnetic oscillating device according to a second embodiment of the present invention. In the magnetic oscillating device shown in FIG. 7, the first magnetic resonance layer 1 is formed of a single ferromagnetic layer. The second magnetic resonance layer 3 is formed of an exchange-coupled film in which a ferromagnetic layer 31 and an antiferromagnetic layer 33 are stacked. Since the ferromagnetic layer 31 and the antiferromagnetic layer 33 are stacked in the second magnetic resonance layer 3, the magnetic resonance frequency of the second magnetic resonance layer 3 can be varied by applying an exchange bias field to the ferromagnetic layer 31.

Figure 8:
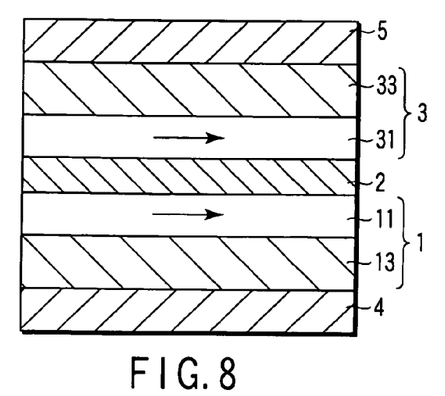
FIG. 8 is a sectional view of a magnetic oscillating device according to a third embodiment of the present invention.

FIG. 8 shows a sectional view of a magnetic oscillating device according to a third embodiment of the present invention. In the magnetic oscillating device shown in FIG. 8, the first magnetic resonance layer 1 is formed of an exchange-coupled film in which an antiferromagnetic layer 13 and a ferromagnetic layer 11 are stacked. The second magnetic resonance layer 3 is formed of an exchange-coupled film in which the ferromagnetic layer 31 and the antiferromagnetic layer 33 are stacked. Since the ferromagnetic layer and the antiferromagnetic layer are stacked in both the first and second magnetic resonance layer 1 and 3, the magnetic resonance frequencies of the first and second magnetic resonance layers 1 and 3 can be varied.

A conventional spin valve film applied to a GMR head or the like also comprises an exchange-coupled film including a ferromagnetic layer (i.e., a pinned layer) and an antiferromagnetic layer. However, in the conventional spin valve film, the antiferromagnetic layer is provided to pin the magnetization of the ferromagnetic layer (i.e., the pinned layer). On the other hand, in the exchange-coupled film serving as the magnetic resonance layer according to the present invention, the antiferromagnetic layer is used to apply an exchange bias field to control a magnetic field acting on the magnetization of the ferromagnetic layer so that the magnetic resonance frequency of the magnetization is varied. Thus, it is unnecessary to apply an exchange bias field intense enough to pin the magnetization in the embodiment of the present invention. The magnitude of the exchange bias field can be controlled by the thickness of the ferromagnetic layer or the antiferromagnetic layer in the exchange-coupled film. For example, the exchange bias field can be reduced by increasing the thickness of the ferromagnetic layer.

To control the magnitude of the exchange bias field, it is also possible to use an exchange-coupled film having a nonmagnetic intermediate layer such as Cu or Ru between a ferromagnetic layer and an antiferromagnetic layer. The nonmagnetic intermediate layer makes it possible to disturb the interface between the ferromagnetic layer and the antiferromagnetic layer or separate the ferromagnetic layer from the antiferromagnetic layer. This enables the adjustment of the magnitude of the exchange bias field acting on the magnetization of the ferromagnetic layer.

Figure 9:
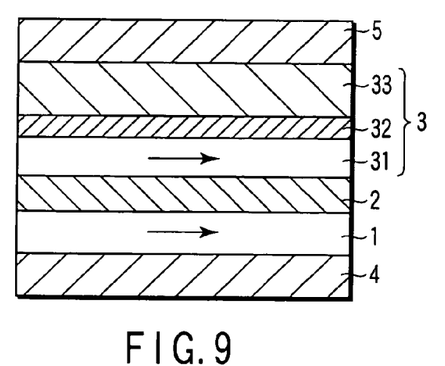
FIG. 9 is a sectional view of a magnetic oscillating device according to a fourth embodiment of the present invention.

FIG. 9 shows a sectional view of a magnetic oscillating device according to a fourth embodiment of the present invention. In the magnetic oscillating device shown in FIG. 9, the second magnetic resonance layer 3 is formed of an exchange-coupled film in which the ferromagnetic layer 31, a nonmagnetic intermediate layer 32, and the antiferromagnetic layer 33 are stacked. The nonmagnetic intermediate layer 32 enables the adjustment of the exchange coupling between the antiferromagnetic layer 33 and the ferromagnetic layer 31. The magnetic resonance frequency of the second magnetic resonance layer 3 can thus be varied.

Figure 10:
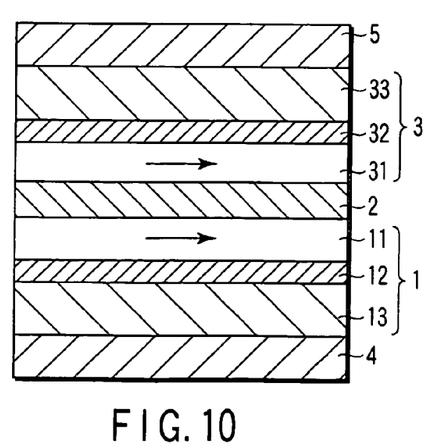
FIG. 10 is a sectional view of a magnetic oscillating device according to a fifth embodiment of the present invention.

FIG. 10 shows a sectional view of a magnetic oscillating device according to a fifth embodiment of the present invention. In the magnetic oscillating device shown in FIG. 10, the first magnetic resonance layer 1 is formed of an exchange-coupled film in which the antiferromagnetic layer 13, nonmagnetic intermediate layer 12, and ferromagnetic layer 11 are stacked. The second magnetic resonance layer 3 is formed of an exchange-coupled film in which the ferromagnetic layer 31, nonmagnetic intermediate layer 32, and antiferromagnetic layer 33 are stacked.

In any of the magnetic oscillating devices shown in FIGS. 6 to 10, a current supplied perpendicularly to the film plane allows the magnetizations of the first and second magnetic resonance layers 1 and 3 to move with a matched phase. These magnetic oscillating devices thus have high energy efficiency and enable magnetic oscillation with excellent output and high frequency stability. For any of the magnetic oscillating devices, the two magnetic resonance layers 1 and 3 have in-plane magnetic anisotropies oriented in the same direction in order to provide high oscillation output. Magnetic oscillation generated by these magnetic oscillating devices utilizes the magnetizing motion in the planes of the two magnetic resonance layers 1 and 3. The magnetic oscillation is elliptically polarized by a demagnetizing field acting perpendicularly to the film plane.

A magnetic oscillating device according to another embodiment of the present invention can provide circularly polarized magnetic oscillation as required. Circularly polarized magnetic oscillation can be obtained by, for example, forming the two magnetic resonance layers of perpendicular magnetization films. In the perpendicular magnetization film, the magnetic anisotropy acting perpendicularly to the film plane is parallel to the demagnetizing field acting perpendicularly to the film plane. This causes the magnetic oscillation to be circularly polarized.

Figure 11:
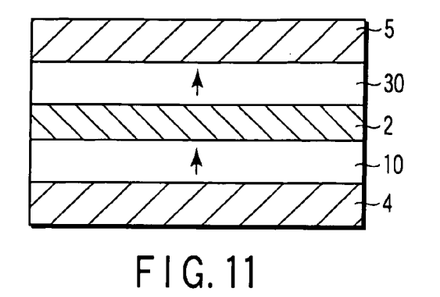
FIG. 11 is a sectional view of a magnetic oscillating device according to a sixth embodiment of the present invention.

FIG. 11 shows a sectional view of a magnetic oscillating device according to a sixth embodiment of the present invention. In the magnetic oscillating device shown in FIG. 11, the lower electrode 4, the first perpendicular magnetization film (the first magnetic resonance layer) 10, the nonmagnetic layer 2, the second perpendicular magnetization film (the second magnetic resonance layer) 30, and the upper electrode 5 are stacked. A material for the first and second perpendicular magnetization films 10 and 30 may be a rare metal/transition metal-based alloy such as Rh/Co, Ru/Co, Pt/Co, Au/Co, Ag/Co, Pd/Co, Ag/Fe, and Pd/Ni. The perpendicular magnetic anisotropy of the perpendicular magnetic film can be controlled by the film thickness. Consequently, control of the thickness of the perpendicular magnetization film makes it possible to achieve the conditions that the difference ($f_2-f_1$) between the two magnetic resonance frequencies is larger than half the resonance line width of the first magnetic resonance layer 1 and that the ratio $f_2/f_1$ of the two magnetic resonance frequencies is 1.6 or less.

In the magnetic oscillating devices according to the embodiments of the present invention, a higher oscillation output is obtained when the ratio of the magnetic resonance frequencies of the first and second magnetic resonance layers is closer to 1.6. The oscillation output can be controlled by an external field. In particular, the output is markedly varied by the external field when the two magnetic resonance layers have magnetic anisotropies oriented in the same direction.

The ferromagnetic layer, nonmagnetic layer, antiferromagnetic layer, or the like used in the magnetic oscillating devices according to the embodiments of the present invention need not be a single layer but may be formed of stacked film including two or more layers. Any structure falls within the scope of the present invention if the magnetic resonance frequencies of the two magnetic oscillating layers are intentionally differed by which magnetic oscillation can be provided by supplying a current.

Next, description will be given of a magnetic head, a matrix-type magnetic head, and a magnetic reproducing apparatus according to embodiments of the present invention.

Figure 12:
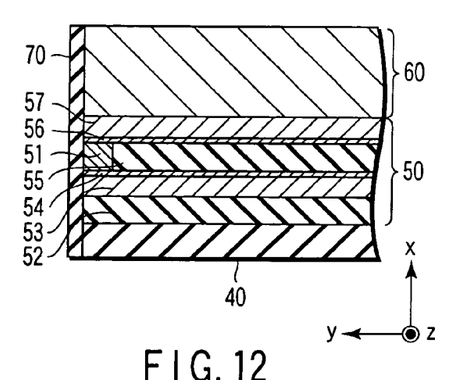
FIG. 12 is a sectional view of a magnetic head according to an embodiment of the present invention.
Figure 13:
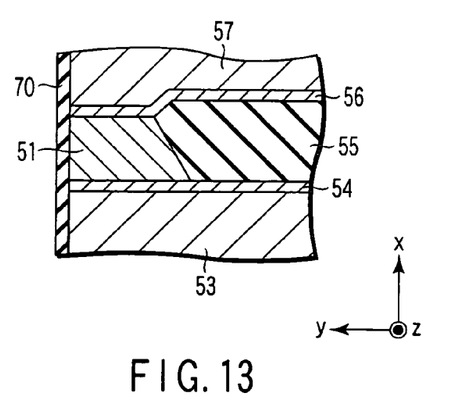
FIG. 13 is an enlarged sectional view showing the vicinity of the magnetic oscillating device in the magnetic head in FIG. 12.
Figure 14:
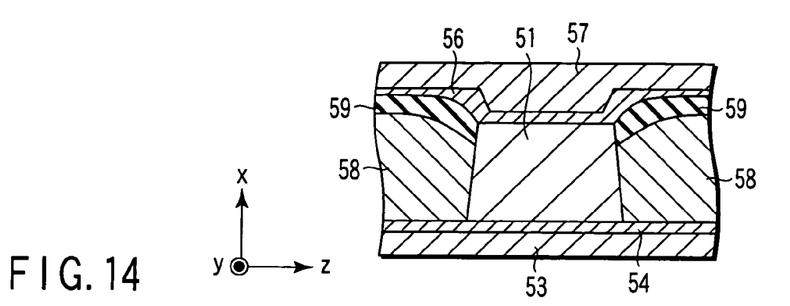
FIG. 14 is an enlarged sectional view showing the vicinity of the magnetic oscillating device in the magnetic head shown in FIG. 12 as viewed from the air-bearing surface.
Figure 15:
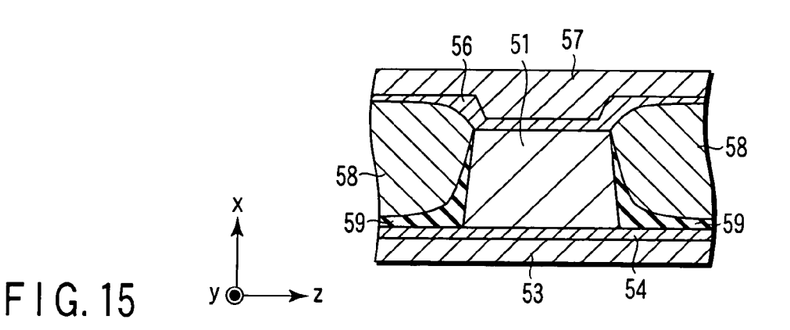
FIG. 15 is a sectional view of a modification of FIG. 14.
Figure 16:
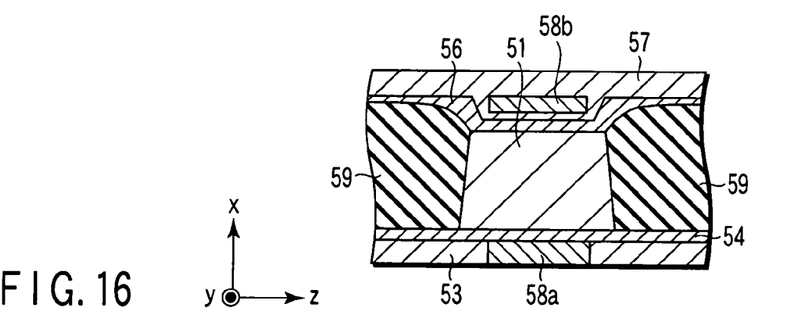
FIG. 16 is a sectional view of another modification of FIG. 14.

FIG. 12 shows a sectional view of the magnetic head according to an embodiment of the present invention. For easiness of description, FIG. 12 shows x, y, and z axes that are perpendicular to one another. The x-axis shows the down track direction on the recording medium. The y-axis shows a direction toward the recording medium. The z-axis shows the cross track direction on the recording medium. The directions of the axes are common to the figures described below. FIG. 13 is an enlarged sectional view showing the vicinity of the magnetic oscillating device in the magnetic head shown in FIG. 12. FIG. 14 is an enlarged sectional view showing the vicinity of the magnetic oscillating device in the magnetic head in FIG. 12 as viewed from the air-bearing surface. FIGS. 15 and 16 show modifications of FIG. 14.

As shown in FIG. 12, the magnetic head according to an embodiment of the present invention has the read head 50 including the magnetic detection element 51 and the write head 60 that are formed on the nonmagnetic substrate 40. As shown in FIGS. 12 and 13, the read head 50 includes the under layer 52, the lower magnetic shield layer 53, the lower metal layer 54, the magnetic oscillating device 51, the insulating layer 55, the upper metal layer 56, and the upper magnetic shield layer 57. The write head 60 is magnetically separated from the read head 50 by the upper magnetic shield layer 57. This enables the read head 50 and the write head 60 to be taken independently into consideration. In the magnetic head according to the embodiment of the present invention, the write head 60 may be used for in-plane magnetic recording or for perpendicular magnetic recording. The write head 60 need not be provided for a read-only magnetic head. A protective film 70 is further provided on the air-bearing surface of the magnetic head.

A material for the nonmagnetic substrate 40 includes $Al_2O_3$—TiC and SiC. A material for the underlayer 52 on the substrate 40 may be an insulating film formed of, for example, $Al_2O_3$. If the material for the substrate 40 has compatibility with the material for the lower magnetic shield layer 53, the underlayer 52 need not be provided. A material for the lower magnetic shield layer 53 on the underlayer 52 may be a soft magnetic material such as NiFe, FeCo, FeCoNi, and Sendust. The lower magnetic shield layer 53 also functions as an electrode. A material for the lower metal layer 54 on the lower magnetic shield layer 53 may be a conductive nonmagnetic metal material such as Ta. The magnetic oscillating device 51 is formed on the lower metal layer 54 so as to face the medium. The insulating layer 55 is formed inward of the magnetic oscillating device 51 with respect to the air-bearing surface. A material similar to the material for the lower metal layer 54 is used for the upper metal layer 56 on the magnetic oscillating device 51 and insulating layer 55. A material similar to the material for the lower magnetic shield layer 53 is used for the upper magnetic shield layer 57 on the lower metal layer 54. The upper magnetic shield layer 57 also functions as an electrode.

As shown in FIGS. 12 and 13, the lower metal layer 54 and the upper metal layer 56 serve to create a desired spacing between the pair of magnetic shield layers which corresponds to the size of a recording bit recorded in the magnetic recording medium. The lower metal layer 54 and the upper metal layer 56 need not necessarily be provided. An electrode layer serves as an electrode only and a magnetic shield layer serves as a magnetic shield only may be provided in place of the lower magnetic shield layer 53 and the upper magnetic shield layer 57, respectively.

The magnetic head according to the embodiment of the present invention is provided with the domain control layer that applies a bias field to the two magnetic resonance layers in the magnetic oscillating device 51. The control of the magnetic anisotropy with the bias field enables the magnetic resonance layer to have a single magnetic domain, thus suppressing Barkhausen noise. The domain control layer is formed of a hard magnetic layer or an exchange-coupled film in which a ferromagnetic layer and an antiferromagnetic layer are stacked. The hard magnetic film includes, for example, CoPt, CoPtCr, and NbFeB.

FIG. 14 is an enlarged sectional view showing the vicinity of the magnetic oscillating device in the magnetic head shown in FIG. 12 as viewed from the air-bearing surface. FIG. 14 shows the magnetic head with a so-called hard abutted structure. As shown in the figure, the domain control layers 58 and the insulating layers 59 are stacked on the both sides of the magnetic oscillating device 51 in the track width direction. A high-resistance nonmagnetic material is used for the insulating layers 59. The insulating layers 59 may be a composite film including two or more insulating layers. The insulating layers 59 can prevent a current passed through the magnetic oscillating device 51 from shunting to the domain control layers 58.

FIG. 15 shows a modification of FIG. 14. In FIG. 15, the insulating layers 59 are formed so as to cover most of the side walls of the magnetic oscillating device 51. The domain control layers 58 are stacked on the insulating layers 59. In FIG; 15, the insulating layers 59 and domain control layers 58 are stacked in the order reverse to that shown in FIG. 14. In FIG. 15, the insulating layers 59 cover most of the side walls of the magnetic oscillating device 51, thus almost perfectly inhibiting a current passed through the magnetic oscillating device 51 from shunting to the domain control layers 58. In this structure, the application of a bias field to the magnetic oscillating device 51 by the domain control layers 58 does not result from magnetic coupling such as ferromagnetic coupling or antiferromagnetic coupling but from the sneaking of a magnetic field from the domain control layers 58 to the magnetic oscillating device 51.

FIG. 16 is a sectional view showing another modification of FIG. 14. In FIG. 16, the domain control layers are provided in a pair of magnetic shield layers arranged above and below the magnetic oscillating device 51, rather than on the side walls of the magnetic oscillating device 51. That is, a domain control layer 58*a* is provided in the lower magnetic shield layer 53. A domain control layer 58*b* is provided in the upper magnetic shield layer 57. The domain control layers 58*a* and 58*b* are desirably formed of a conductive hard magnetic layer or an exchange-coupled film in which ferromagnetic layer and an antiferromagnetic layer are stacked, so as not to hinder the current supply through the magnetic shields 53 and 57. In FIG. 16, only insulating layers 59 are formed so as to cover the both sides of the magnetic oscillating device 51. The insulating layers 59 enable a current to be passed through the magnetic oscillating device 51 without shunting.

In any of the magnetic heads shown in FIGS. 14 to 16, the domain control layers suppress Barkhausen noise and the insulator layers avoid shunting to remove unwanted noise. This makes it possible to minimize the degradation of sensitivity of the magnetic oscillating device 51.

Thus, the magnetic heads according to the embodiments of the present invention are unlikely to be affected by thermal noise owing to the use of the precession through resonance of the two magnetizations of the two magnetic resonance layers in the magnetic oscillating device. The magnetic heads further suppresses Barkhausen noise. This makes it possible to sense a very weak magnetic field from a very small area, thus making it possible to achieve sensitive magnetic reproduction.

Next, description will be given of the magnetic reproducing apparatus according to an embodiment of the present invention.

Figure 17:
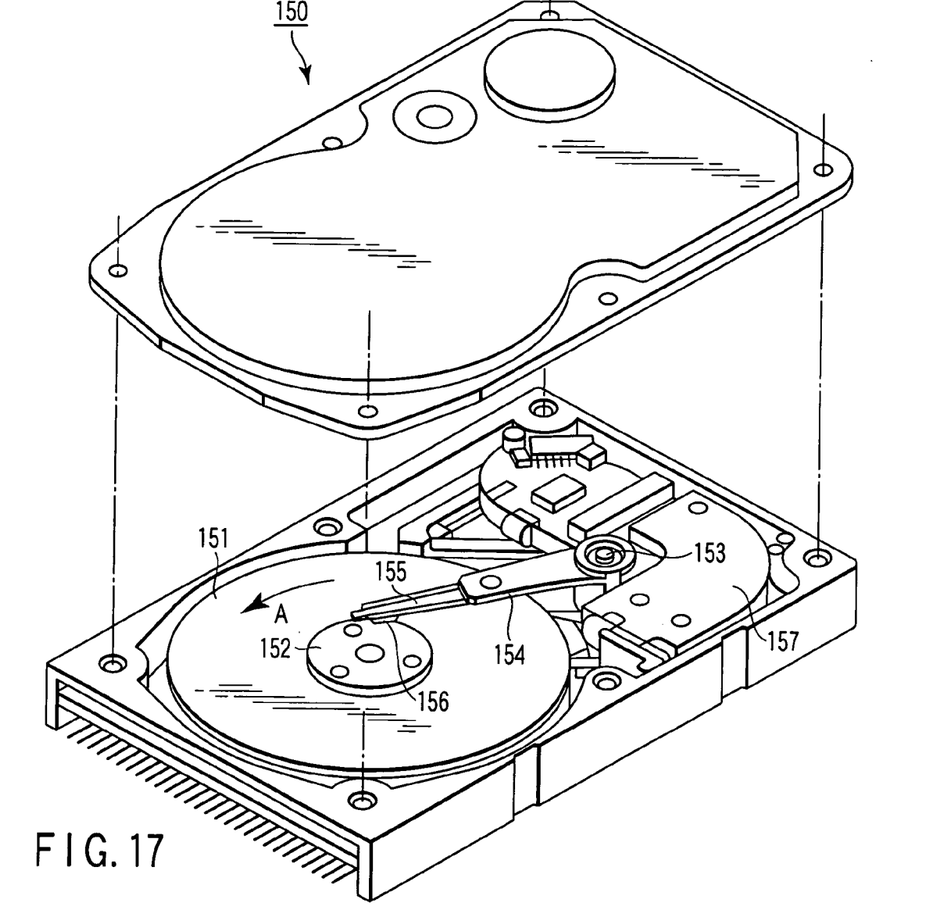
FIG. 17 is a perspective view of a magnetic reproducing apparatus according to an embodiment of the present invention.

FIG. 17 is a perspective view of a magnetic recording and reproducing apparatus 150 according to an embodiment of the present invention. A magnetic disk (a magnetic recording medium) 151 is mounted on a spindle 152 and rotated in the direction of arrow A by a spindle motor. An actuator arm 154 is held by a pivot 153 provided near the magnetic disk 151. A suspension 155 is attached to the tip of the actuator arm 154. A head slider 156 is supported on a bottom surface of the suspension 155. The magnetic head described with reference to FIGS. 12 to 16 is mounted on the head slider 156. A voice coil motor 157 is formed at the proximal end of the actuator arm 154.

The magnetic disk 151 is rotated and the voice coil motor 157 pivotally moves the actuator arm 154 to load the head slider 156 onto the magnetic disk 151. The air-bearing surface (ABS) of the head slider 156, in which the magnetic head is mounted, is held at a predetermined flying height from the surface of the magnetic disk 151. The head slider 156 may be of a so-called contact type that contacts the magnetic disk 151. Then, data recorded in the magnetic disk 151 can be read.

Figure 18:
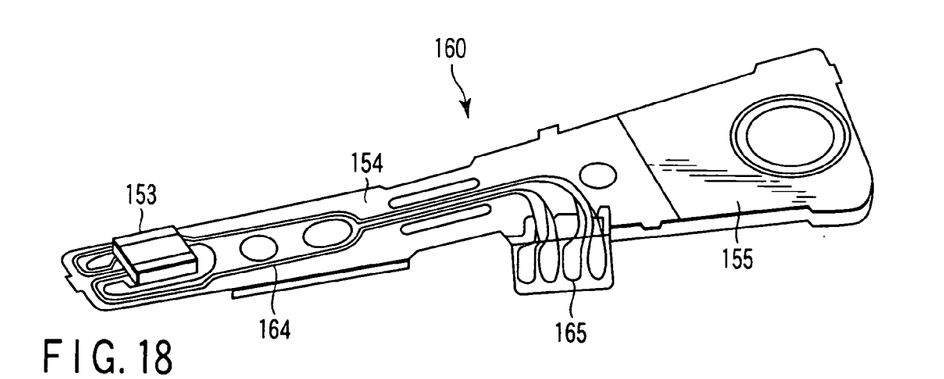
FIG. 18 is a perspective view of a magnetic head assembly in the magnetic reproducing apparatus according to an embodiment of the present invention as viewed from a magnetic disk.

FIG. 18 is an enlarged perspective view of the magnetic head assembly as viewed from the magnetic disk. The magnetic head assembly 160 includes the actuator arm 155, having the suspension 154 connected to one end. The head slider 153 is attached to the tip of the suspension 154, and the head slider 153 has any of the magnetic heads described with reference to FIGS. 12 to 16. Leads 164 for signal write or read operation are wired on the suspension 154. The leads 164 are electrically connected to each electrode in the magnetic head incorporated into the head slider 153. Reference numeral 165 denotes electrode pads on the magnetic head assembly 160.

The magnetic reproducing apparatus according to the embodiment of the present invention can sensitively read data magnetically recorded in the magnetic disk 151 more densely than in the prior art, using any of the magnetic heads described with reference to FIGS. 12 to 16.

Now, description will be given of a matrix-type magnetic head in which the magnetic heads according to an embodiment of the present invention are arrayed.

Figure 19:
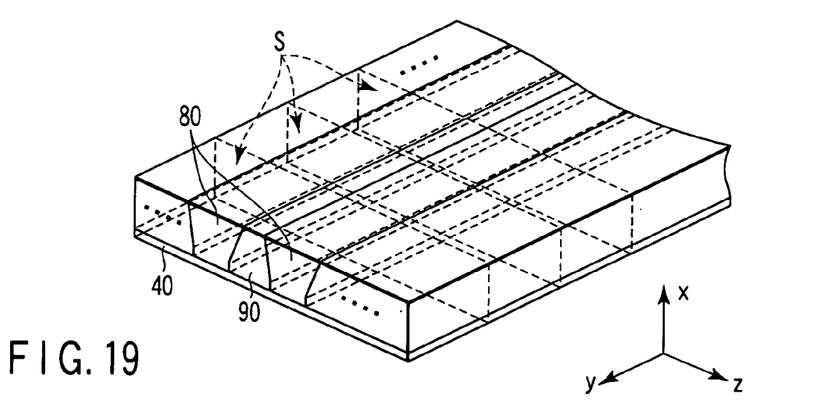
FIG. 19 is a perspective view showing that a plurality of unit magnetic heads according to an embodiment of the present invention are formed on a substrate.
Figure 20:
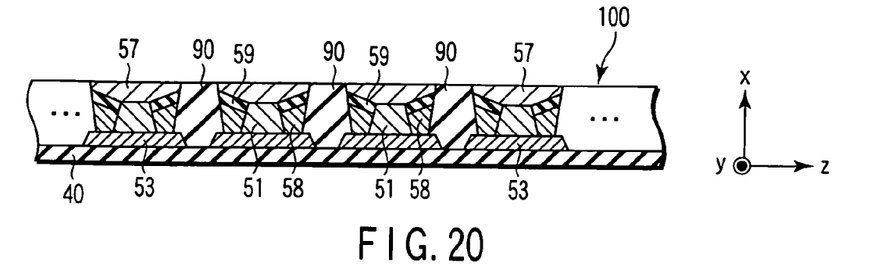
FIG. 20 is a sectional view of a one-dimensional array taken from FIG. 19, as viewed from the air-bearing surface.

FIG. 19 is a perspective view showing that a plurality of unit magnetic heads of one of the types described with reference to FIGS. 12 to 16 are formed on a substrate in the manufacture of a matrix-type magnetic head. FIG. 20 is a sectional view of a one-dimensional array taken from FIG. 19 as viewed from the air-bearing surface.

As shown in FIG. 19, a plurality of unit magnetic heads 80 are arrayed at equal intervals in the z-axis direction (i.e., the cross track direction) with insulating layers 90 interposed therebetween. The substrate is cut at cutting planes S at equal intervals in the y-axis direction to produce a one-dimensional arrays 100 in which the unit magnetic heads 80 are one-dimensionally arrayed as shown in FIG. 20. The unit magnetic heads 80 are magnetically and electrically separated from one another by the insulating layers 90, each located between the magnetic heads 80.

As shown in FIG. 20, the unit magnetic heads 80 included in the one-dimensional array 100 have, for example, the structure as shown in FIG. 14. The lower magnetic shield layer 53 is formed on the nonmagnetic substrate 40. The magnetic oscillating device 51 is formed on the lower magnetic shield layer 53, and stacks each including the domain control layer 58 and insulating layer 59 are located adjacent to the both sides of the magnetic oscillating device 51. The upper magnetic shield layer 57 is formed thereon. The domain control layer 58 and insulating layer 59 are not limited to the structure shown in FIG. 14 but may use the structure in FIG. 15 or 16. Each unit magnetic head has almost the same structure as that of the already described magnetic head. The one-dimensional array 100 may be used as one-dimensional matrix-type magnetic head.

For example, in FIG. 20, a write head may be provided on the upper magnetic shield layer 57 in each unit magnetic head. This makes it possible to use the matrix-type magnetic head according to the embodiment of the present invention not only as the read head but also as the read and write head.

Figure 21:
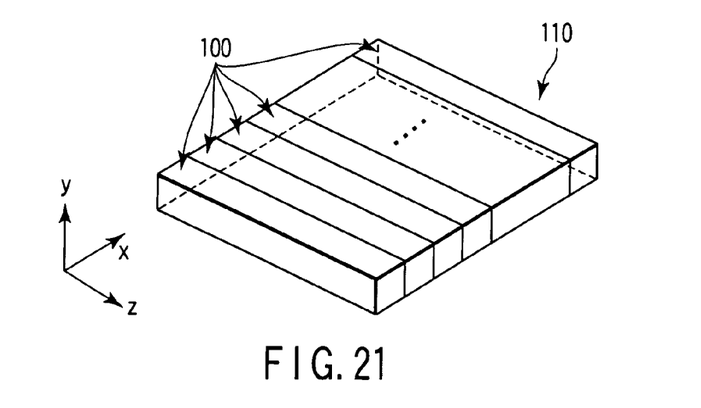
FIG. 21 is a perspective view of a rectangular matrix-type magnetic head according to an embodiment of the present invention.

FIG. 21 shows a perspective view of a rectangular matrix-type magnetic head 110 formed by arraying the one-dimensional arrays 100 in parallel. In FIG. 21, the top surface corresponds to the air-bearing surface. Wires (not shown) are formed on the back surface of the magnetic head in FIG. 21 so that a current can be supplied between the lower magnetic shield layer 53 and the upper magnetic shield layer 57 in each unit magnetic head.

Figure 22:
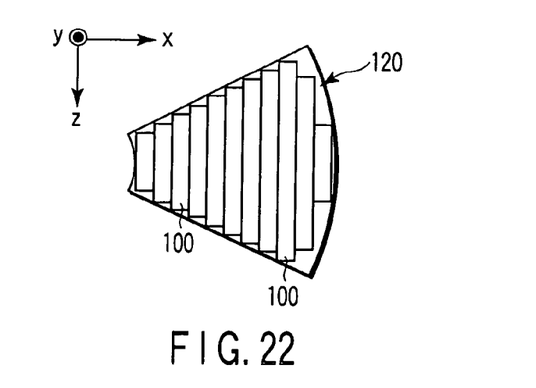
FIG. 22 is a plan view of a fan-shaped matrix-type magnetic head according to another embodiment of the present invention.

The shape of the matrix-type magnetic head is not limited and may be different from a rectangle such as the one shown in FIG. 21. FIG. 22 shows a plan view of a fan-shaped matrix-type magnetic head 120 formed by arraying the one-dimensional arrays 100 in parallel, as viewed from the air-bearing surface. Alternatively, a circular matrix-type magnetic head can be produced.

The matrix-type magnetic head according to the embodiment of the present invention allows the unit magnetic heads to operate independently. It is thus suitable for reading data magnetically recorded in the recording medium in parallel. Parallel write operations can also be performed by providing a write head in each unit magnetic head as described above.

Figure 23:
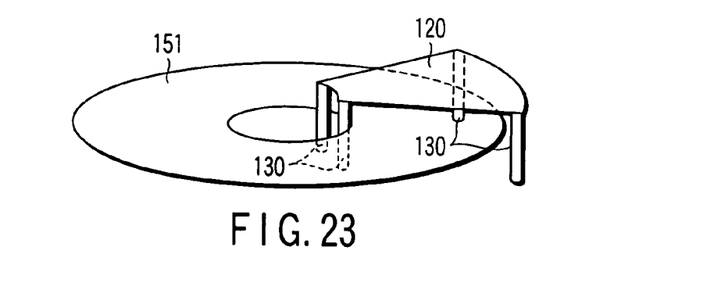
FIG. 23 is a perspective view of a magnetic reproducing apparatus having the matrix-type magnetic head in FIG. 22.

FIG. 23 shows a perspective view of a magnetic reproducing apparatus in which the matrix-type magnetic head in FIG. 22 is mounted. In FIG. 23, two poles 130 are provided in each of the inner and outer peripheral portions of the magnetic disk 151. The fan-shaped matrix-type magnetic head 120, shown in FIG. 22, is fixed to the poles 130. In the magnetic reproducing apparatus shown in FIG. 23, the poles 130 and the matrix magnetic head 120 are provided in place of the actuator arm, suspension, head slider, and magnetic head in FIG. 17. Of course, the matrix-type magnetic head 120 may be movable.

Since the unit magnetic heads included in the matrix-type magnetic head 120 in FIG. 23 can be independently operated, plural bits recorded in the magnetic disk 151 can be simultaneously read by using an appropriate algorithm such that the unit magnetic heads operate cooperatively. This makes it possible to sensitively and quickly read data magnetically recorded more densely than in the prior art.

The embodiments of the present invention have been described with reference to the specific examples. However, the present invention is not limited to these specific examples. For example, the present invention can be similarly implemented to exert similar effects by those skilled in the art by appropriately selecting the shapes and materials of the shield layer, domain control layer, insulating layer, and the like. The magnetic reproducing apparatus according to the embodiments of the present invention may be of a rigid type in which a rigid magnetic recording medium is installed or a removable type in which the magnetic recording medium can be exchanged. The scope of the present invention includes all the magnetic heads and magnetic reproducing apparatuses that can be implemented by those skilled in the art by appropriately altering the designs of the above magnetic head and magnetic reproducing apparatus.

EXAMPLES

Several specific magnetic oscillating devices will be described below.

Example 1

The magnetic oscillating device in the present example has the structure shown in FIG. 6. Co is used for the first and second magnetic resonance layers 1 and 3. The magnitude of a uniaxial anisotropic field of a Co film is known to vary with the thickness thereof. Thus, Co layers with different film thicknesses are used for the first and second magnetic resonance layers 1 and 3 so as to differentiate the magnetic resonance frequency specific to the first and second magnetic resonance layers 1 and 3. The two Co layers are deposited so as to have magnetic anisotropies in the same direction. Cu is used for the nonmagnetic layer. The deposition is carried out by sputtering.

First, Cu [100 nm] and Ta [5 nm] are deposited as the lower electrode 4 on a silicon substrate having a thermal oxide film formed thereon. The surface of the lower electrode 4 is polished to improve flatness. On the lower electrode 4, a Co layer with a thickness of about 1.5 nm as the first magnetic resonance layer 1, a Cu layer with a thickness of about 2 nm as the nonmagnetic layer 2, and a Co layer with a thickness of about 2 nm as the second magnetic resonance layer 3 are sequentially deposited, and further Cu [10 nm] and Au [10 nm] are deposited thereon as the upper electrode 5. Micromachining is performed using electron beam lithography and Ar ion beam milling to produce a device with a junction area of about 100 nm×80 nm.

The device is connected to one end of a coplanar guide with a central conductor width of 50 μm. A spectrum analyzer is used to detect a microwave output from the device. An oscillating field is applied perpendicularly to the film plane of the device, with the ferromagnetic resonance absorption spectrum of the device examined. The peak corresponding to the magnetic resonance frequency of the magnetization of the first magnetic resonance layer 1 (that is the Co layer of film thickness about 1.5 nm) is observed at about 17.5 GHz, and the peak corresponding to the magnetic resonance frequency of the magnetization of the second magnetic resonance layer 3 (that is the Co layer of film thickness about 2 nm) is observed at about 19 GHz. The peak at about 17.5 GHz has a resonance line width of about 0.5 GHz. When a direct current is supplied from the lower electrode 4 to the upper electrode 5 and the current density is raised to $2\times10^7$ A/cm$^2$ or more, microwave oscillation with a frequency of about 19.5 GHz is observed. Oscillation intensity increases consistently with the current density.

Example 2

The magnetic oscillating device in the present example has the structure shown in FIG. 7. The first magnetic resonance layer 1 is formed of a single ferromagnetic layer. The second magnetic resonance layer 3 is formed of an exchange-coupled film in which the ferromagnetic layer 31 and the antiferromagnetic layer 33 are stacked. The present example uses a manufacturing method similar to that in Example 1.

As shown in FIG. 7, a Cu film with a thickness of 10 nm as the lower electrode 4, a Co film with a thickness of 5 nm as the first magnetic resonance layer 1, a Cu film with a thickness of 3 nm as the nonmagnetic layer 2, a Co film with a thickness of 5 nm as the ferromagnetic layer 31 in the second magnetic resonance layer 3, an IrMn film with a thickness of about 8 nm as the antiferromagnetic layer 33 in the second magnetic resonance layer 3, and a Cu film with a thickness of 10 nm as the upper electrode 5 are used. The device has a junction area of about 100×100 nm$^2$.

In a resonance spectrum through ferromagnetic resonance, two peaks are observed at frequencies of about 14.4 GHz and about 15.5 GHz. It is assumed that the resonance frequency of the magnetization of the first magnetic resonance layer 1 corresponds to the peak at about 14.4 GHz and the resonance frequency of the magnetization of the second magnetic resonance layer 3 of an exchange-coupled film corresponds to the peak at about 15.5 GHz. The peak at about 14.4 GHz has a resonance line width of about 0.3 GHz. When a direct current is supplied from the lower electrode 4 to the upper electrode 5 and the current density is raised to $9\times10^6$ A/cm$^2$ or more, a microwave oscillation with a frequency of about 16 GHz is observed. Oscillation intensity increases consistently with the current density.

Example 3

The magnetic oscillating device in the present example has a structure shown in FIG. 8. The first magnetic resonance layer 1 is formed of an exchange-coupled film in which the ferromagnetic layer 11 and the antiferromagnetic layer 13 are stacked. The second magnetic resonance layer 3 is formed of an exchange-coupled film in which the ferromagnetic layer 31 and the antiferromagnetic layer 33 are stacked. IrMn is used for the antiferromagnetic layers. Co is used for the ferromagnetic layers. The present example uses a manufacturing method similar to that in Example 1.

Specifically, a Cu layer [about 10 nm], an IrMn layer [about 10 nm], a Co layer [about 3 nm], a Cu layer [about 5 nm], a Co layer [about 3 nm], an IrMn layer [about 7 nm], and a Cu layer [about 20 nm] are stacked. The device has a junction area of about 50×100 nm$^2$.

In a resonance spectrum through ferromagnetic resonance, peaks corresponding to the exchange-coupled film of the Co layer [about 3 nm]/IrMn layer [about 7 nm] and the exchange-coupled film of the Co layer [about 10 nm]/IrMn layer [about 10 nm] are observed at frequencies of about 27.2 GHz and about 29.1 GHz, respectively. The peak at about 27.2 GHz has a resonance line width of about 0.8 GHz. When a direct current is supplied from the lower electrode 4 to the upper electrode 5 and the current density is raised to $4.6\times10^7$ A/cm$^2$ or more, a microwave oscillation with a frequency of about 32 GHz is observed.

Example 4

The magnetic oscillating device in the present example has the structure shown in FIG. 11. Both magnetic resonance layers are formed of a perpendicular magnetization film. A stack of Co/Ru is used for the perpendicular magnetization films. The present example uses a manufacturing method similar to that in Example 1.

Specifically, a Cu layer [about 20 nm], a Co layer [about 0.8 nm], a Ru layer [about 2 nm], a Cu layer [about 2 nm], a Co layer [about 0.6 nm], a Ru layer [about 2 nm], and a Cu layer [about 40 nm] are stacked. The device has a junction area of about 100×100 nm$^2$. A small difference is made in thicknesses between the Co ferromagnetic layers constituting the two perpendicular magnetization films, in view of the dependence of the effective perpendicular magnetic anisotropy on the thickness thereof.

In a resonance spectrum through ferromagnetic resonance, two peaks are observed at frequencies of about 12 GHz and about 16 GHz. It is generally believed that the perpendicular magnetic anisotropy is originated from lattice distortion. It is thus difficult to determine which of the resonance frequencies of the magnetizations of the two perpendicular magnetization films corresponds to each of the two peaks. However, oscillation with a frequency of about 17 GHz is observed when a direct current with a current density of $2\times10^7$ A/cm$^2$ or more is supplied from the upper electrode 5 to the lower electrode 4. Consequently, the magnetic frequencies of the magnetizations of the lower and upper perpendicular magnetic films are interpreted to correspond to the peaks at about 16 GHz and about 12 GHz, respectively. The peak at about 12 GHz has a resonance line width of about 0.2 GHz. The ratio of the resonance frequencies is about 1.3. The oscillation intensity increases consistently with the current density.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic oscillating device comprising:
   a first magnetic resonance layer with a first intrinsic magnetic resonance frequency $f_1$;
   a second magnetic resonance layer with a second intrinsic magnetic resonance frequency $f_2$ higher than the first intrinsic magnetic resonance frequency $f_1$;
   a nonmagnetic layer sandwiched between the first magnetic resonance layer and the second magnetic resonance layer; and
   a pair of electrodes which supplies a current perpendicularly to film planes of the first and second magnetic resonance layers,
   wherein a difference ($f_2-f_1$) between the two intrinsic magnetic resonance frequencies is larger than half a resonance line width of the first magnetic resonance layer, and a ratio of the two intrinsic magnetic resonance frequencies $f_2/f_1$ is 1.6 or less, and wherein the matched resonance frequency is different from both the first intrinsic magnetic resonance frequency $f_1$ and the second intrinsic magnetic resonance frequency $f_2$.

2. The device according to claim 1, wherein the ratio of the two intrinsic magnetic resonance frequencies $f_2/f_1$ is 1.4 or less.

3. The device according to claim 1, wherein each of the first and second magnetic resonance layers is formed of a ferromagnetic layer with in-plane magnetic anisotropy.

4. The device according to claim 1, wherein each of the first and second magnetic resonance layers is formed of a ferromagnetic layer with in-plane magnetic anisotropy, and at least one of the ferromagnetic layers has a pair of bias magnetic films on both sides of the ferromagnetic layer.

5. The device according to claim 1, wherein each of the first and second magnetic resonance layers is formed of an exchange-coupled film in which a ferromagnetic layer with in-plane magnetic anisotropy and an antiferromagnetic layer are stacked.

6. The device according to claim 1, wherein one of the first and second magnetic resonance layers is formed of a ferromagnetic layer with in-plane magnetic anisotropy, and the other is formed of an exchange-coupled film in which a ferromagnetic layer with in-plane magnetic anisotropy and an antiferromagnetic layer are stacked.

7. The device according to claim 1, wherein each of the first and second magnetic resonance layers is formed of an exchange-coupled film in which a ferromagnetic layer with in-plane magnetic anisotropy, a nonmagnetic intermediate layer adjusting a magnitude of an exchange bias field, and an antiferromagnetic layer are stacked.

8. The device according to claim 1, wherein one of the first and second magnetic resonance layers is formed of a ferromagnetic layer with in-plane magnetic anisotropy, and the other is formed of an exchange-coupled film in which a ferromagnetic layer with in-plane magnetic anisotropy, a nonmagnetic intermediate layer adjusting a magnitude of an exchange bias field, and an antiferromagnetic layer are stacked.

9. The device according to claim 1, wherein at least one of the first and second magnetic resonance films is formed of a perpendicular magnetization film.

10. A magnetic sensor comprising:
the magnetic oscillating device according to claim 1; and
a detector detecting, as a variation in resistance, a variation depending on an external field in an angle between magnetizations of the first and second magnetic resonance layers where two magnetizations are in precessions with a matched resonance frequency, the precessions being excited by supplying a current.

11. The sensor according to claim 10, wherein the matched resonance frequency is different from both the first intrinsic magnetic resonance frequency $f_1$ and the second intrinsic magnetic resonance frequency $f_2$.

12. A magnetic head comprising:
the magnetic oscillating device according to claim 1;
a domain control layer which applies a bias field to the magnetic oscillating device to control magnetic domains in the first and second magnetic resonance layers;
an insulating layer provided so as to allow a current to be supplied perpendicularly to a film plane of the magnetic oscillating device; and
a pair of magnetic shield layers sandwiching the magnetic oscillating device.

13. A matrix-type magnetic head comprising unit magnetic heads, each of which comprises the magnetic head according to claim 12, arrayed in a matrix with an insulating layer interposed therebetween.

14. A magnetic reproducing apparatus comprising:
the magnetic head according to claim 12; and
a magnetic recording medium.

15. The magnetic head according to claim 12, further comprising a detector detecting, as a variation in resistance, a variation depending on an external field in an angle between magnetizations of the first and second magnetic resonance layers where two magnetizations are in precessions with a matched resonance frequency, the precessions being excited by supplying a current.

16. The magnetic head according to claim 15, wherein the matched resonance frequency is different from both the first intrinsic magnetic resonance frequency $f_1$ and the second intrinsic magnetic resonance frequency $f_2$.

17. The device according to claim 1, wherein a magnetization of the first magnetic resonance layer and a magnetization of the second magnetic resonance layer are in precessions with a matched resonance frequency when a current is supplied perpendicularly to film planes of the first and second magnetic resonance layers.

* * * * *